(12) United States Patent
Morello

(10) Patent No.: US 7,558,686 B1
(45) Date of Patent: Jul. 7, 2009

(54) METHOD AND APPARATUS FOR DISPLAYING A REPRESENTATION OF A SIGNAL

(75) Inventor: Gino F. Morello, Leonia, NJ (US)

(73) Assignee: Veritium Research LLC, Fort Lee, NJ (US)

( * ) Notice: Subject to any disclaimer, the term of this patent is extended or adjusted under 35 U.S.C. 154(b) by 234 days.

(21) Appl. No.: 11/293,725

(22) Filed: Dec. 2, 2005

(51) Int. Cl.
*G01R 13/02* (2006.01)

(52) U.S. Cl. .................................................. 702/67

(58) Field of Classification Search ............ 702/67; 708/315, 321
See application file for complete search history.

(56) References Cited

U.S. PATENT DOCUMENTS

| | | | |
|---|---|---|---|
| 3,814,868 A | 6/1974 | Bradley | |
| 3,906,173 A | 9/1975 | Bradley | |
| 3,927,281 A | 12/1975 | Bradley | |
| 3,985,980 A | 10/1976 | Bradley | |
| 4,021,625 A | 5/1977 | Bradley | |
| 4,039,769 A | 8/1977 | Bradley | |
| 4,041,254 A | 8/1977 | Bradley et al. | |
| 4,061,892 A | 12/1977 | Bradley | |
| 4,227,407 A | 10/1980 | Drost | |
| 4,327,258 A * | 4/1982 | Zumbahlen et al. | 375/226 |
| 4,391,124 A | 7/1983 | Drost et al. | |
| 4,434,648 A | 3/1984 | Drost et al. | |
| 4,550,606 A | 11/1985 | Drost | |
| 4,568,802 A | 2/1986 | Bradley et al. | |
| 4,736,377 A | 4/1988 | Bradley et al. | |
| 5,003,248 A * | 3/1991 | Johnson | 324/121 R |
| 5,072,168 A | 12/1991 | Ferguson | |
| 5,138,252 A | 8/1992 | Ferguson | |
| 5,337,403 A * | 8/1994 | Klingman | 345/440 |
| 5,721,689 A | 2/1998 | Hart et al. | |
| D409,308 S | 5/1999 | Drost et al. | |
| 6,036,645 A | 3/2000 | Drost et al. | |
| 6,263,738 B1 | 7/2001 | Hogle | |
| 6,681,191 B1 * | 1/2004 | Pickerd et al. | 702/76 |
| 6,746,408 B2 | 6/2004 | Krivitski et al. | |
| 6,833,695 B2 * | 12/2004 | Shen et al. | 324/158.1 |
| 6,868,739 B1 | 3/2005 | Krivitski et al. | |

OTHER PUBLICATIONS

Bracewell, Ronald N., "The Fourier Transform and Its Applications", McGraw-Hill, Inc. Second Edition, 1986, pp. 6-18, 189-216, 356-381.

(Continued)

*Primary Examiner*—Tung S Lau
*Assistant Examiner*—Aditya S Bhat
(74) *Attorney, Agent, or Firm*—Jeffrey M. Weinick; Wolff & Samson PC

(57) ABSTRACT

Disclosed is a signal analyzer that can receive a signal generated by an external system. The signal has a plurality of frequency components. The signal analyzer generates a suppressed phasor domain representation of the signal by selectively removing at least one component for use as a reference. The signal analyzer then displays the suppressed phasor domain representation of the signal. In one embodiment, the signal analyzer removes the component of greatest magnitude. The signal analyzer can also (or alternatively) remove a user selected component. In addition to the suppressed phasor domain, the signal analyzer can simultaneously display the frequency domain, the time domain, the numerical domain, and/or the modulation domain.

10 Claims, 5 Drawing Sheets

OTHER PUBLICATIONS

Bradley, Frank, "Technical Bulletin, Suppressed Tone Phasor Domain Measurement", Frank Bradley, Aug. 15, 1976, pp. 1-17.
Bradley, Frank, "PB-IC-D Operator's Manual", Bradley Telcom Corp., Oct. 1, 1984, pp. 3-1 to 3-13, 4-1 to 4-12.
Brigham, E. Oran, "The Fast Fourier Transform FFT and Its Applications", Prentice-Hall, Inc., 1988, pp. 131-156, 167-195, 272-290.
Cooley, J.W., Tukey, J.W., "An Algorithm for the Machine Calculation of Complex Fourier Series", Math Computation, vol. 19, 1965, pp. 297-301.
Crenshaw, Jack W., "All About Fourier Analysis, Part I," Embedded Systems Programming, Oct. 1994, pp. 70-90.
Crenshaw, Jack W., "All About Fourier Analysis, Part II," Embedded Systems Programming, Jan. 1995, pp. 32-52.
Crenshaw, Jack W., "All About Fourier Analysis, Part III," Embedded Systems Programming, Feb. 1995, pp. 82-96.
Crenshaw, Jack W., "All About Fourier Analysis, Part IV," Embedded Systems Programming, Apr. 1995, pp. 78-99.
Hamming, R.W., "Digital Filters", Dover Publications, Inc., Third Edition, 1989, pp. 22, 102-121, 177, 179.
Haykin, Simon, "Adaptive Filter Theory", Prentice-Hall, Inc., Third Edition, 1996, pp. 701-731.
Higgins, Richard J., "Digital Signal Processing in VLSI", Prentice-Hall, Inc., 1990, pp. 1-20, 117-153, 256-272.
Transonic Systems, Inc., "Flow-Based Intraoperative Coronary Graft Patency Assessment", Transonic Systems, Inc. 2002.
Transonic Systems, Inc., "T400 Operator's Manual", Transonic Systems, Inc., Revision C, Sep. 2002, pp. 1-14, 1-17.
Transonic Systems, Inc., "T106 Operator's Manual", Transonic Systems, Inc., Revision Mar. 1997, pp. A1-A12, A17, A28.
Oppenheimer, Alan V., "Applications of Digital Signal Processing", Prentice-Hall, Inc., 1978, pp. 11, 20, 129.
Proakis, John G., Manolakis Dimitris G., "Digital Signal Processing Principles, Algorithms & Applications", Prentice-Hall, Inc., 3rd Ed., 1996, pp. 21-39, 230-286, 448-473.
Smith, Doug, "Digital Signal Processing Technology", The American Radio-Relay League, Inc., 2001, pp. 2-1-2-15.
Stanley, Alan V., Dougherty, Alan V, Dougherty, Ray, "Digital Signal Processing", Reston Publishing Company, Inc., 2nd Ed. 1984, pp. 282-315, 317-354.
Steiglitz, Ken, "A Digital Signal Processing Primer", Addison-Wesley Publishing Company, Inc., 1996, pp. 149-172.

* cited by examiner

METHOD AND APPARATUS FOR DISPLAYING A REPRESENTATION OF A SIGNAL

BACKGROUND OF THE INVENTION

The present invention relates generally to displaying a representation of a signal, and more particularly to displaying a suppressed phasor domain representation of a signal.

Voltages, currents, or other physical quantities are usually represented by continuous-time signals. A signal has several characteristics typically of interest, such as its amplitude, frequency, and phase. A signal's amplitude is the magnitude or size of its respective unit of measure relative to a baseline. A periodic signal's frequency is its rate of recurrence per unit time. A signal's phase is its angular or time relationship relative to another signal.

Characteristics of a signal can be represented in various domains. For example, in the time domain, a signal is typically represented as a linear, amplitude versus time plot. The amplitude information is traditionally plotted along the ordinate while the time information is traditionally plotted along the abscissa. A device such as an oscilloscope often displays a signal in the time domain.

Another domain typically of interest is the frequency domain. The frequency domain provides another way of viewing a signal by representing the signal as an amplitude versus frequency plot having linear or logarithmic axes. The amplitude information is traditionally plotted along the ordinate while the frequency information is traditionally plotted along the abscissa. The frequency domain is used to view the amplitude contributions at various frequencies within a more complex composite signal (i.e., a signal containing multiple frequencies). A device such as a spectrum analyzer often displays a signal in the frequency domain.

A third domain used to represent signals is the phasor domain. The phasor domain represents a signal as a rotating vector whose length is proportional to the instantaneous amplitude of the signal and whose angular position relative to a reference plane is proportional to the instantaneous phase of the signal.

One known application of the phasor domain has occurred in the telecommunications field. Troubleshooting along a telephone network that may be several thousand miles long and involves thousands of individual hardware items had been a difficult task. As described in U.S. Pat. No. 3,814,868 to Bradley, an instrument was then developed to measure the characteristics of telephone lines to facilitate the identification of sources of data transmission errors. Bradley's instrument enabled a user to view the suppressed phasor domain as well as some numerical values.

To use Bradley's instrument, a pure sinusoidal test tone is introduced into a telephone network. When a pure sinusoidal test tone is transmitted through a communication channel, impairments in the channel may induce on that tone a wide range of disturbances/perturbations such as noise, phase modulation, amplitude modulation, interfering tones, harmonics resulting from nonlinear distortion, and transients of various kinds. If the steady-state component of the received signal is displayed in the phasor domain as a vertical phasor, the disturbances (which are not stationary with respect to the test tone) add vectorially and on an instantaneous basis to the tip of that phasor. The entire phasor does not need to be shown because its coordinates (whether polar or rectangular) are completely defined by a point representing the location of its tip with respect to the reference axes.

Thus, when an output signal is later received, the output signal includes the test tone and disturbances acquired during the transmission through the telephone network. Bradley's instrument received the output signal and subtracted out a replica of the test tone to obtain the disturbances. The instrument then displayed these disturbances in the suppressed phasor domain to provide a user with the ability to analyze the disturbances.

BRIEF SUMMARY OF THE INVENTION

I have discovered that much can be learned about a signal and its characteristics by viewing the signal in the suppressed phasor domain and another domain simultaneously. In one embodiment of the present invention, a signal analyzer simultaneously displays a suppressed phasor domain representation of a received signal and a representation of the signal in another domain. The signal may be simultaneously displayed, therefore, in the suppressed phasor domain and one or more of the frequency domain, time domain, numerical domain, and modulation domain.

In one embodiment of the invention, the signal analyzer converts a received analog signal to a digital form. The signal analyzer then converts the digital form of the received signal from the time domain into the frequency domain by performing a time to frequency domain transform such as the Fourier Transform on the signal to produce an array of signal components. The signal analyzer then removes one or more components from the array of components. The component(s) removed may be automatically selected by the signal analyzer or may be selected by a user of the signal analyzer. After one or more components are removed from the array of components, the signal analyzer then converts the resultant array from the frequency domain back into the time domain by performing a frequency to time domain transform such as the Inverse Fourier Transform on the array to generate a residual time domain signal. To display the suppressed phasor domain, the signal analyzer then digitally multiplies the residual signal with in-phase and quadrature signals derived from the removed component. The in-phase signal has the same magnitude and phase as the removed component. The quadrature signal has the same magnitude as the removed component but is 90 degrees out of phase with respect to the removed component.

In accordance with another embodiment of the present invention, the signal analyzer receives a signal generated by an external system where the received signal has a plurality of frequency components. The signal analyzer generates a suppressed phasor domain representation of the signal by selectively removing at least one component. The signal analyzer then displays the suppressed phasor domain representation. In one embodiment, the signal analyzer removes the component of greatest magnitude. The signal analyzer can also (or alternatively) remove a user selected component. In addition to the suppressed phasor domain, the signal analyzer can simultaneously display the frequency domain, the time domain, the numerical domain, and/or the modulation domain.

The signal analyzer can operate on various test signals, such as physiological signals (e.g., a heart rate signal, a blood flow rate signal, a pressure signal, etc.) and other real-world signals (e.g., a voltage signal, a current signal, a signal representing other physical quantities, etc.). Real-world signals, for example, may be derived from various transducers used in petrochemical processing facilities, automotive platforms, or aircraft platforms.

These and other advantages of the invention will be apparent to those of ordinary skill in the art by reference to the following detailed description and the accompanying drawings.

DETAILED DESCRIPTION

Figure 1:
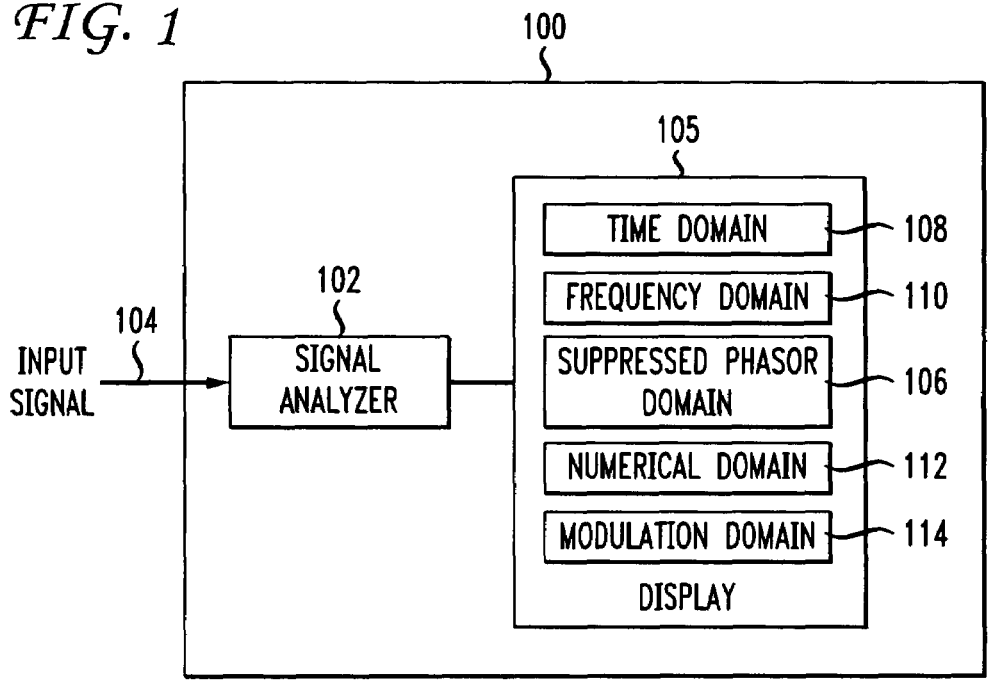
FIG. 1 shows a high level block diagram of a signal analyzer receiving an input signal and representing the input signal in the time domain, frequency domain, and/or suppressed phasor domain in accordance with an embodiment of the invention.

FIG. 1 shows a high level block diagram of a system 100 in accordance with the invention having a signal analyzer 102. The signal analyzer 102 receives an analog input signal 104 for analysis. The signal analyzer 102 then displays the input signal 104 on display 105 in the suppressed phasor domain 106 and one or more additional domains simultaneously. The additional domains include the time domain 108, the frequency domain 110, the numerical domain 112, and/or the modulation domain 114.

The signal analyzer 102 can extract and display a signal's mean, minimum, maximum, root-mean-square (rms) (i.e., the effective value of a periodic function, defined by the square root of the mean value of the sum of the squared values of a function), peak, peak-to-peak, peak-to-average, and peak-to-rms (i.e., Crest Factor) values.

When the input signal 104 is displayed in the time domain 108, perturbations of the signal's amplitudes, frequencies, and phases may not be fully characterized and understood from this perspective alone because there are an infinite number of ways that perturbations may cause amplitude variations.

The signal analyzer 102 can also represent the input signal 104 in the frequency domain 110. The frequency domain 110 enables a user to view the constituent frequency components of the composite input signal 104. Additionally, component relationships and distortion levels (e.g., total harmonic distortion) may be derived from the frequency domain representation. The representation of signals in the frequency domain 110, however, may not show the phase relationship between the signals in real-time in a comprehensible manner.

The signal analyzer 102 can also represent a signal numerically in a numerical domain. A numerical domain is when the signal analyzer 102 only displays numbers (e.g., mean value, peak value, etc.) on the display 105. This can be useful to medical personnel, for example, who want to view the signal analyzer's display quickly for particular values of a signal without viewing a plot of the signal. The signal analyzer 102 can also represent a signal in a modulation domain. The modulation domain is a representation of the signal's frequency versus time.

The suppressed phasor domain 106 provides a comprehensible, real-time display of all perturbations and their associated frequency, amplitude, and phase characteristics relative to a reference component. As described in more detail below, the signal analyzer 102 represents the signal in the suppressed phasor domain by converting a digital representation of the analog input signal 104 to an array of frequency components. The signal analyzer 102 then suppresses or removes a component (i.e., the reference component) to display only the perturbations in the phasor domain. The reference component is typically the input signal's fundamental frequency or any harmonic of the fundamental frequency. In one embodiment, the signal analyzer 102 automatically suppresses the component of greatest magnitude. The signal analyzer 102 may also enable a user to select a component to be removed. This removal occurs by, for example, inserting a magnitude of zero in the reference component's respective frequency bin or by subtracting the reference component from the array of components. In addition to or alternative to removing the reference component, the user may selectively remove or suppress additional frequency components in an attempt to yield a better understanding of the signal's characteristics at frequencies otherwise hidden or obscured by components of greater magnitude.

In one embodiment, a user may use the suppressed phasor domain representation to determine the instantaneous amplitude, frequency, and/or phase relationships of any signal component with respect to the suppressed reference component or with respect to another signal component. The amplitude information of various components and their rates of change (i.e., df(t)/dt) may be used to detect the presence of abnormalities in the flow path when measuring, e.g., blood flow. The relative phase information of various components may be used to identify the relative position of the abnormality (e.g., whether upstream or downstream of the measurement location). Phase positions may be constant, may advance, or may retard with respect to other components.

Viewing a signal in different domains often facilitates a better understanding of the signal's characteristics. Sometimes, one or more characteristics of a signal may not be apparent to a viewer when viewed in a single domain alone. For example, suppose two input signals of constant frequency and constant amplitude are being added together in a circuit with variable phase to produce a resultant output signal. If the two input signals and the resultant output signal are viewed in the time domain (e.g., using an oscilloscope), then the resultant output signal's wave shape will change as the phase relationship of the two input signals changes. If, however, the same two input signals and resultant output signal are viewed in the frequency domain (e.g., using a spectrum analyzer) as the phase relationship between the two input signals is varied, then nothing changes in the frequency domain representation because the frequencies and amplitudes of the signals remain constant. This characteristic (i.e., that the frequencies and amplitudes have not changed) is much more apparent when viewing the signals in the frequency domain versus viewing the signals in the time domain.

Moreover, a display of a signal in the suppressed phasor domain may provide additional information. As described above, the suppressed phasor domain may display amplitude, frequency, and phase relationships of components within a signal in a more comprehensible manner. Thus, with respect to the signal described in the above example, as phase is varied the user would view a pattern of constant shape rotating in a direction proportional to the phase value and at a rate proportional to the rate of change of the phase value. Therefore, viewing the signal in the suppressed phasor domain and one or more additional domains simultaneously provides a user with a more complete "picture" of the signal's characteristics.

In one embodiment, a loudspeaker may be connected to the signal analyzer 102 in addition to the display 105 to provide audio output. For example, as the amplitude and frequency of the suppressed phasor domain representation changes, the volume and tone of the audio output changes accordingly. Another example includes when the amplitude of the signal in the suppressed phasor domain representation falls outside of a predetermined value, an audio tone is sounded, thereby providing an alarm for the user. The loudspeaker therefore adds an auditory component to the visual analysis of the signal characteristics.

Figure 2:
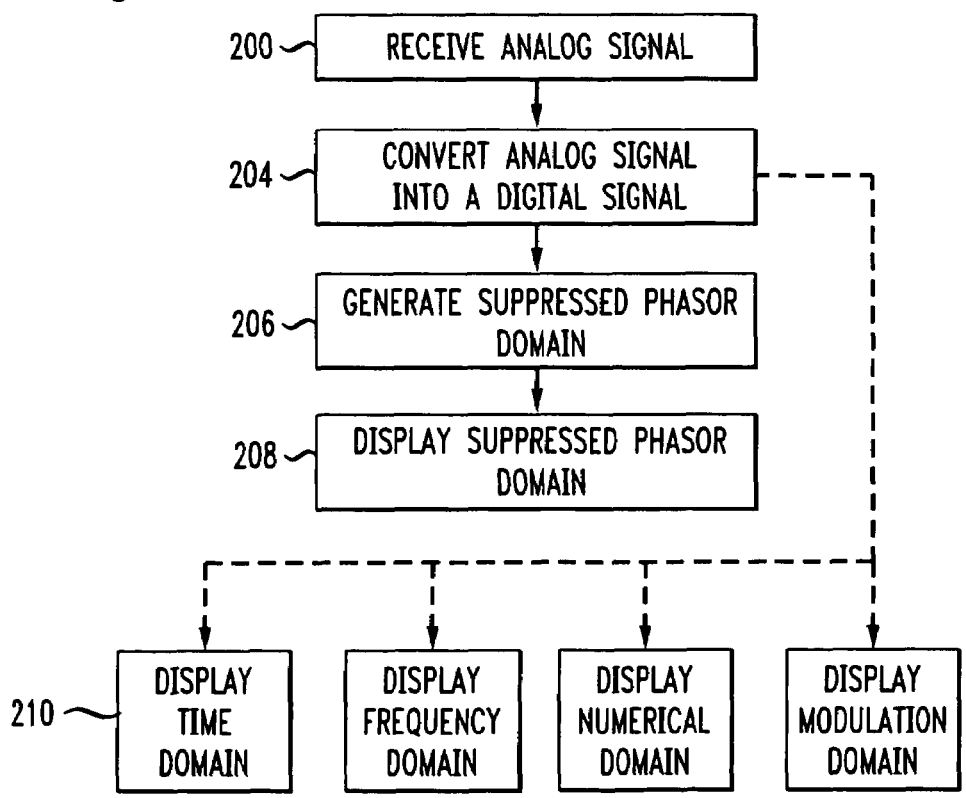
FIG. 2 is a flowchart showing the steps performed by the signal analyzer to represent a signal in different domains.

FIG. 2 is a flowchart showing the steps performed by the signal analyzer 102 to represent a signal in different domains. The signal analyzer 102 receives an analog signal 104 as input in step 200. In one embodiment, the signal analyzer 102 may receive multiple input signals. If the signal analyzer 102 receives more than one input signal, the signal analyzer 102 may automatically select a particular signal to analyze and display. Alternatively, the signal analyzer 102 can enable a user to select the analog input signal of interest.

The signal analyzer 102 then converts the analog input signal 104 into a corresponding digital signal for storing and/or processing in step 204. In another embodiment, the signal analyzer 102 receives a digital signal as input. As described in more detail below, once the analog input signal 104 is converted to a digital signal, the signal analyzer 102 generates a suppressed phasor domain representation of the digital signal in step 206. The signal analyzer 102 then displays the suppressed phasor domain representation of the digital signal in step 208. The signal analyzer 102 can also display one or more of the time domain, frequency domain, numerical domain, and modulation domain simultaneous with the suppressed phasor domain (as shown with the dashed arrows).

Figure 3:
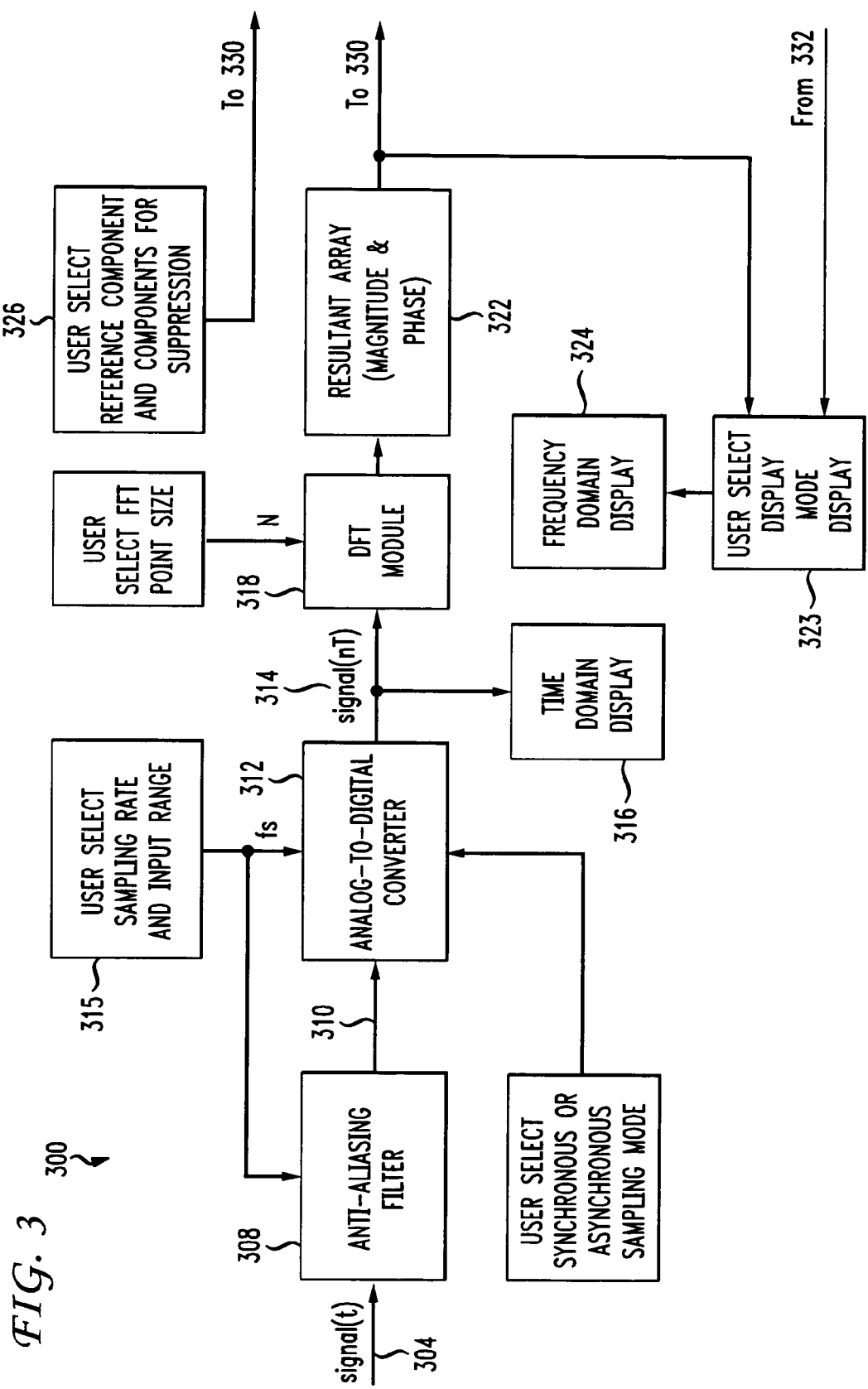
FIG. 3 shows a more detailed block diagram of the signal analyzer in accordance with an embodiment of the invention.
Figure 3:
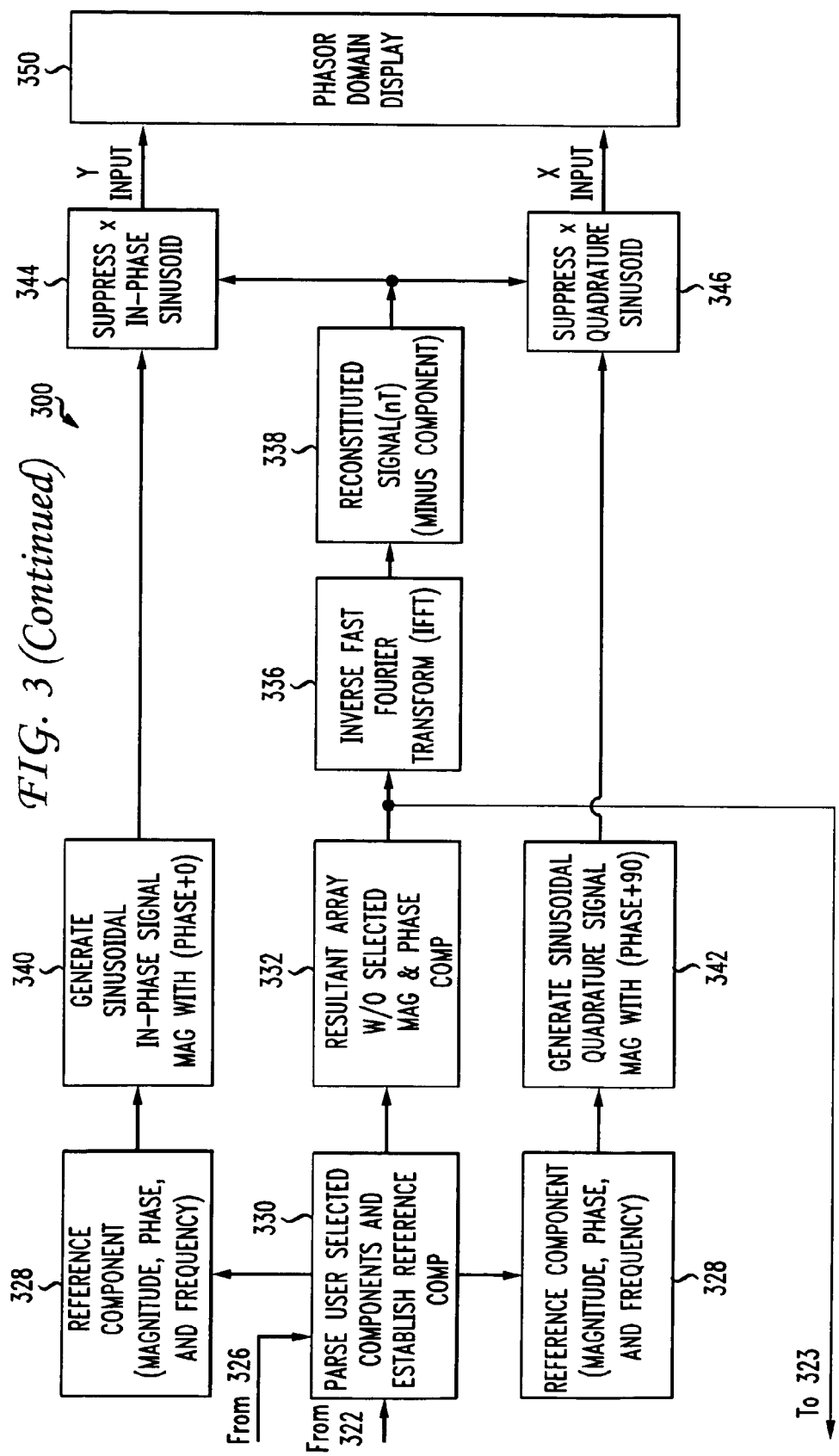
Figure 4:
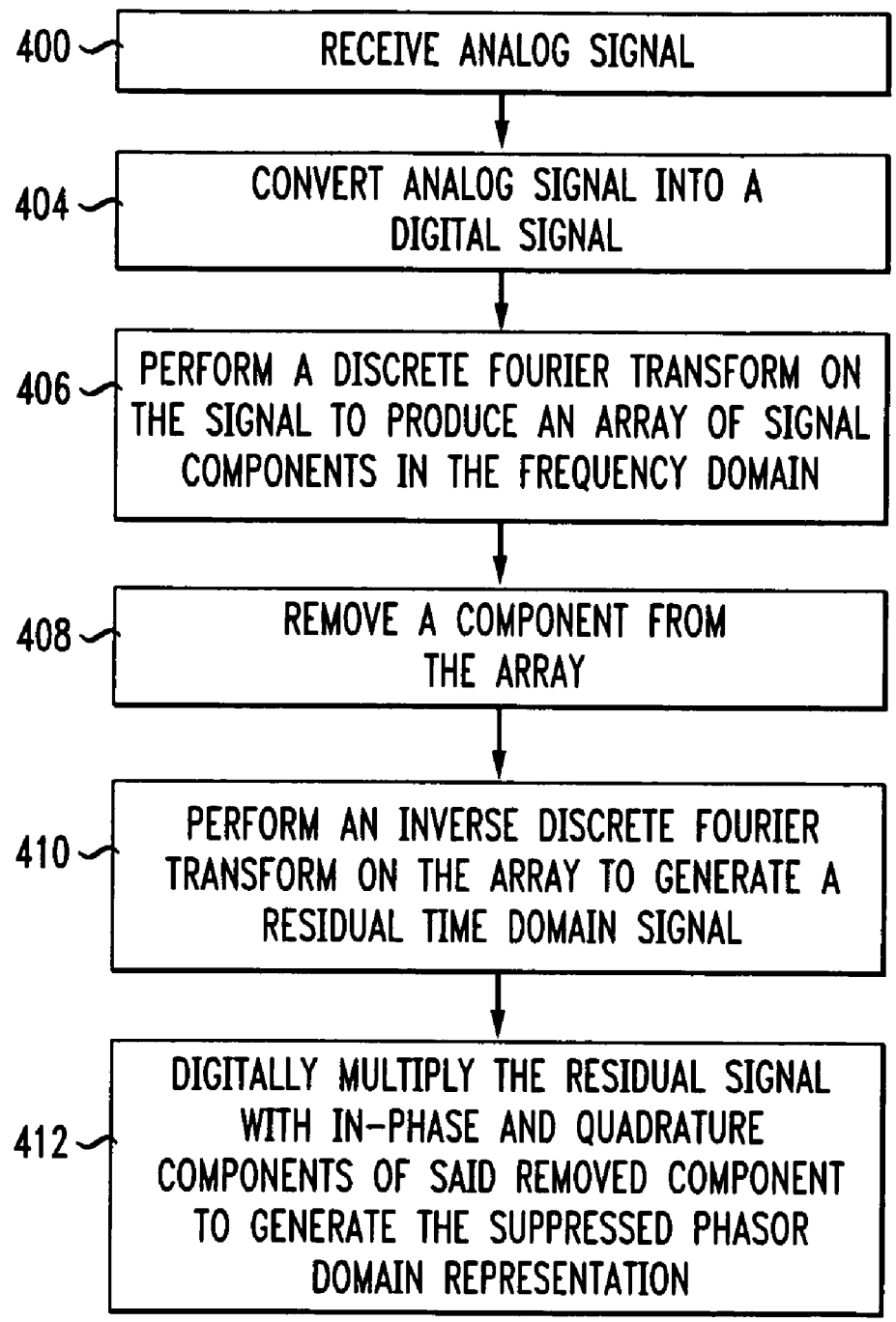
FIG. 4 is a flowchart showing the steps performed by the signal analyzer to generate the suppressed phasor domain representation of a signal.

FIG. 3 shows a more detailed block diagram of the signal analyzer in accordance with an embodiment of the invention. FIG. 4 shows a flowchart detailing the steps performed by the signal analyzer to generate the suppressed phasor domain representation of a signal.

Signal analyzer 300 receives an analog input signal 304 (also referred to as signal (t)) in step 400. The signal analyzer 300 then transmits the analog input signal 304 to an anti-aliasing filter 308 to perform anti-aliasing filtering on the input signal 304 before the input signal 304 is converted to a digital signal. The anti-aliasing filter 308 ensures that the bandwidth of the analog input signal 304 is confined to below the Nyquist frequency or one half the sampling frequency (fs). Frequencies above the Nyquist rate, if sampled by the analog-to-digital converter, create inaccuracies within the sampled data set. In particular, if the frequency used to sample the analog signal during conversion to a digital signal is less than a minimum frequency needed to represent the continuous analog input signal 304 digitally, then the sampled data will be erroneous. The sampling frequency is often set to be at least twice the maximum frequency to be sampled to ensure good fidelity and no loss in information. The anti-aliasing filter's cutoff frequency is selected to ensure that the sampled data accurately represents the continuous-time analog signal.

The anti-aliasing filter 308 then sends a filtered analog signal 310 to the analog-to-digital (A/D) converter 312. The A/D converter 312 converts the filtered analog signal 310 to a digital signal 314 in step 404. In particular, the A/D converter 312 samples the filtered analog signal 310 at a particular sampling rate to obtain a discrete number of samples (e.g., binary words) that can be processed, analyzed, stored, displayed, and transmitted by the signal analyzer 300. In one embodiment, the sampling occurs synchronously (e.g., at a rate proportional to an integer multiple of the fundamental frequency contained within the sampled signal or an integer multiple of a selected harmonic contained in the sampled signal). The digital signal 314 is represented in FIG. 3 as signal (nT), where T is the sampling period ($T=1/f_s$) and nT is the sampling time.

In one embodiment, the filtered analog signal 310 may be sampled asynchronously (e.g., when the user selects the sampling rate for the analog to digital conversion (as shown by block 315) or when the signal analyzer automatically selects the optimum sampling rate after analyzing the filtered analog signal 310). The higher the sampling rate, the greater the number of binary samples acquired per unit time. A greater number of samples at a sufficiently high resolution generally results in a better (i.e., more accurate) representation of the filtered analog signal 310. Higher sampling rates and resolutions, however, add to the system's computational complexity and data storage requirements.

A user may also select an input range for the analog to digital conversion. The selection of an input range enables the user to properly configure the system's analog input circuitry to best accommodate the dynamic range of signal 304 which the user wants to convert to a digital format (and eventually display). The user selection of the sampling rate and/or the input range may also adjust the anti-aliasing filter 308.

The digital signal 314 can then be represented in the time domain 316 on a display (e.g., a computer monitor, a laptop computer, a cathode ray tube (CRT) display, a liquid crystal display (LCD), etc.).

The A/D converter 312 outputs digital representations of analog input signal 304 as digital signal 314 and feeds it forward to a Discrete Fourier Transform (DFT) module 318. The Discrete Fourier Transform is a mathematical technique used to decompose signals (e.g., the digital signal 314) to sinusoids. In one embodiment, the user can select the DFT point size N, the number of samples in a record, which will yield N/2 frequency bins after transforming the signal into the frequency domain. Thus, the user can determine what frequency resolution the DFT output generates by specifying the sampling rate ($f_s$) and point size (N) where the frequency resolution is defined by $F=f_s/N$.

The following is a brief background of the Fourier Transform (FT) and the Discrete Fourier Transform (DFT). An analog waveform (e.g., the analog input signal 304) usually consists of a voltage or a current waveform that is a function of time. The instantaneous value of the voltage (or current) fluctuates as a function of time. The relative levels of the various frequency components which the waveform is comprised of is given by the voltage (or current) spectrum. This spectrum is obtained by taking the Fourier Transform of the voltage (or current) waveform over all time.

The Fourier Transform of a waveform w(t) is defined as:

$$W(f) = \int_{-\infty}^{\infty} (w(t))e^{-j2\pi ft}\,dt$$

W(f) is a complex function of frequency. W(f) may be decomposed into two real functions X(f) and jY(f).

The spectrum of a waveform can also be approximated by using the DFT. The DFT is defined by:

$$X(n) = \sum_{k=0}^{k=N-1} x(k)e^{-j(2\pi/N)nk}$$

where n=0, 1, 2, ..., N−1.

The DFT is a discrete approximation of the Fourier Transform and may be implemented using a computationally efficient Fast Fourier Transform (FFT) algorithm. The output of the DFT module 318 is a resultant array 322 of magnitudes and phases at frequencies from 0 Hz (DC) to [$f_s/2-(f_s/N)$] Hz. This resultant array 322 can then be displayed (per user selection in block 323) as the frequency domain representation 324 of the analog input signal 304.

To represent the input signal in the suppressed phasor domain, a reference component 328 of the resultant array 322 is removed in step 408. In one embodiment, the signal analyzer 300 removes a predetermined component of the array 322, such as the component having the greatest magnitude. Alternatively, the user selects a component as the reference component in block 326.

The signal analyzer 300 then parses the user selected (or predetermined) component(s) from the array 322 and establishes a reference component in block 330. A resultant array 332 (without the suppressed component) is created by the signal analyzer 300.

The signal analyzer 300 then performs an Inverse Discrete Fourier Transform (IDFT) 336 on the resultant array 332 to convert the resultant array 332 back to a residual signal 338 in the time domain in step 410.

The signal analyzer 300 also generates a sinusoidal in-phase signal 340 and a quadrature signal 342 from the reference component 328. These signals are normalized to the magnitude and phase of the reference component 328. The in-phase signal 340 has the same magnitude and phase as the reference component 328 and is the reference component 328 represented as a sinusoidal signal. The quadrature signal 342 has the same magnitude as the reference component 328 but shifted by ninety degrees (i.e., $$\frac{\pi}{2}$$

radians). As described below, the quadrature signal 342 and in-phase signal 340 are used by the signal analyzer 300 to generate the suppressed phasor domain representation.

In particular, the in-phase and quadrature signals 340, 342 are digitally multiplied by the residual signal 338 in blocks 344 and 346 and used to generate the suppressed phasor domain display 350 in step 412. The multiplication of the residual signal 338 by the in-phase signal 344 and the quadrature signal 346 effectively isolates the amplitude modulation and phase modulation components of the residual signal 338.

Figure 5A:
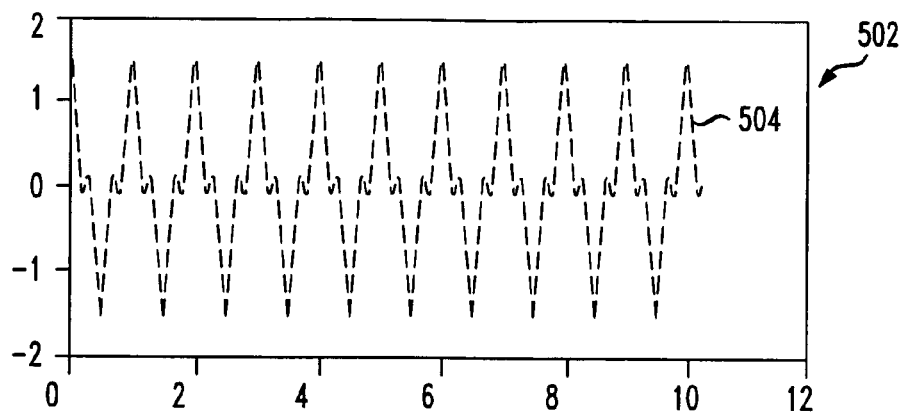
FIG. 5A shows a graphical representation of an input signal in the time domain.
Figure 5B:
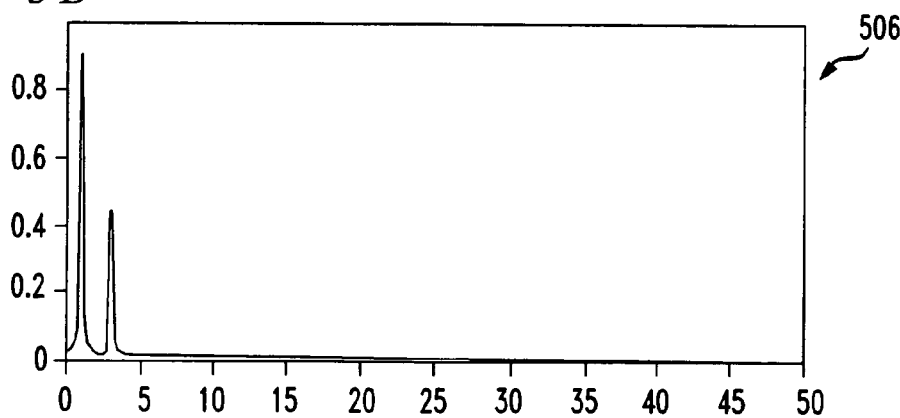
FIG. 5B shows a graphical representation of the input signal in the frequency domain.
Figure 5C:
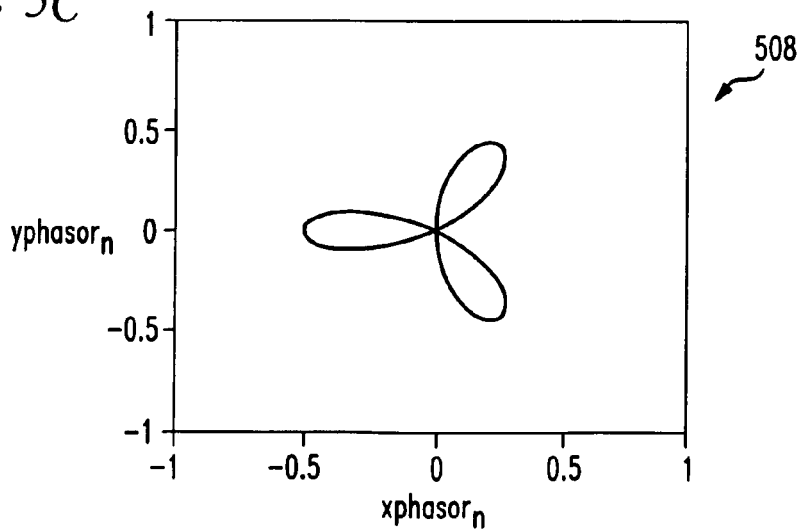
FIG. 5C shows a graphical representation of the input signal in the suppressed phasor domain.

FIGS. 5A, 5B, and 5C are graphical representations of a signal in the time domain, frequency domain, and suppressed phasor domain respectively. Suppose that the signal analyzer is configured to have a sampling rate $f_s$ of 100 Hz, thereby having a sample period of $$T_s = \frac{1}{f_s} = 0.01 \text{ seconds.}$$

The signal analyzer processes a record containing N number of samples, where N=1024. A hypothetical input signal is an analog waveform comprised of two sinusoids at respective frequencies $f_1$=1 Hz and $f_2$=3 Hz and amplitudes of $A_1$=1 V and $A_2$=0.5 V, at a phase angle θ=0 degrees. A plot of the waveform is generated using N samples: n=0 ... N−1. The sampled waveform is defined as:

$$g_n = A_1 \cos(2\pi f_1 nT_s) + A_2 \cos(2\pi f_2 nT_s + \theta).$$

Time domain plot 502 illustrates the time domain representation 504 of the sampled waveform. The signal analyzer converts the time sampled signal into the frequency domain 506 using the Fast Fourier Transform as described above.

$$F = FFT(g); \text{ where } k=0..N-1;$$

$$\frac{f_s}{N} = 0.098 \text{ Hz}$$

The frequency domain representation 506 of the signal illustrates that the input signal has two frequency components (i.e., one at 1 Hz and one at 3 Hz).

As described above, the signal analyzer suppresses the fundamental component at $f_1$ and generates the in-phase and quadrature signal:

In-phase signal: $x_n = \cos(2\pi f_1 nT_s)$

Quadrature signal:

$$y_n = \cos\left(2\pi f_1 nT_s + \frac{\pi}{2}\right)$$

Residual Signal: $r_n = x_n - g_n$

The signal analyzer then multiplies the in-phase and quadrature signals by the residual signal to obtain:

xphasor$_n$: $x_n r_n$ yphasor$_n$: $y_n r_n$

A representation of the residual signal in the suppressed phasor domain is shown in graphical representation 508. The signal analyzer represents the suppressed phasor domain by representing the residual signal in the suppressed phasor domain. The phasor domain representation of the signal may be displayed using polar or rectangular coordinates on a linear or logarithmic scale.

A user may selectively activate individual virtual cursors for making on-screen measurements. Cursors can include a pair or pairs of vertical and horizontal lines which may be moved by the user and whose ends intersect the display's axes such that the user may directly read values from the axes.

Further, in one embodiment the phasor domain representation includes circles marked to represent predetermined magnitude and/or phase levels. Also, a user can activate a virtual circular cursor whose center is referenced at the display's origin and whose diameter may be selectively increased or decreased by the user so as to make relative measurements from the origin to a selected point on the display. This type of cursor can enable a user to quickly and easily make precise amplitude measurements while in the phasor domain.

In another embodiment, the user may activate a virtual vector which emanates radially outward from the display's origin and whose length and angle may be selected by the user so as to make relative measurements from the origin to a selected point on the display, thereby yielding concurrent amplitude and phase information. This type of cursor can enable a user to quickly and easily make precise amplitude and phase measurements while in the phasor domain.

The signal analyzer can be used in numerous applications. In one embodiment, the signal analyzer can measure signals at low frequencies (e.g., below 20 Hz). Frequencies below 20 Hz are typically important to many clinicians and researchers because this low frequency band includes heart rate information and respiratory information. For example, heart rates in humans are typically between 60 and 180 beats per minute (BPM) which translates to 1 and 3 Hertz (Hz).

The signal analyzer, although generally applicable, may be used to measure and view physiological signals. Physiological signals are signals from living organisms such as humans. They may be directly measured, such as through electrodes attached to a person's skin, or indirectly measured, such as through a pressure transducer.

If an input signal represents a patient's blood flow, a user (e.g., medical personnel such as a physician, a nurse, or a clinician) can have the signal analyzer display the signal's derivative in the time domain to view the blood's acceleration and deceleration. Rapid changes in blood's acceleration/deceleration may indicate, for example, a valvular problem, a thrombus (i.e., an aggregation of blood factors causing vascular obstruction at the point of its formation), or other abnormalities within the blood vessel. The user may also view the signal's integral, which may be useful when measuring vascular volumetric flows over some time interval of interest. Thus, the signal analyzer can measure physiological pressures, vascular flow rates, and respiratory information to name a few.

Analysis of physiologic signals in the suppressed phasor domain may be used to indicate whether a thrombus formation (i.e., an aggregation of blood factors causing vascular obstruction at the point of its formation), stenosis (i.e., a narrowing of a passage), or aneurysm (i.e., a localized, pathological, blood-filled dilation of a blood vessel caused by a disease or weakening of the vessel's wall) is present in a blood vessel or graft. Analysis of the signal in the suppressed phasor domain may also be used to indicate the patency of a graft or to evaluate and diagnose vascular diseases. The graft may be constructed of autograft, allograft, xenograft, or of synthetic material. A user may also use the suppressed phasor domain to determine whether retrograde or regurgitant (i.e., backward moving) flow is present in a blood vessel or graft.

For example, in physiological monitoring applications, the input signal may correspond to blood flow rate. When converting the analog input signal proportional to flow rate from the time domain to the frequency domain, the largest component in the resulting array will typically correspond to the patient's heart rate. If the heart rate component is suppressed (selected by the user or automatically performed by the signal analyzer), the suppressed phasor domain representation will represent flow contributions and possibly perturbations displayed with respect to the heart rate component. The phase information may indicate which side of the monitoring site the problem may be located at (depending on whether the phase of the additive components lead or lag the phase of the heart rate component). The user may also select additional components to remove depending on what types of additive components may be present on the residual signal. The removal of additional components may be utilized to further magnify smaller components of interest in the suppressed phasor representation of the input signal.

The signal analyzer 102 can also be used to analyze signals from petrochemical processing systems, such as petrochemical processing system pressures and flows. Additionally, signals relating to engine performance may be analyzed on automotive and aircraft platforms.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

The invention claimed is:

1. A method for displaying a representation of a signal, the method comprising:
   receiving a signal; and
   simultaneously displaying 1) a suppressed phasor domain representation of said signal, and 2) a representation of said signal in another domain,
   wherein said displaying said suppressed phasor domain representation of said signal further comprises:
      performing a time to frequency domain transform on said signal to produce an array of signal components in the frequency domain, and removing a component from said array of signal components;
      performing a frequency to time domain transform on said array to generate a residual time domain signal; and
      digitally multiplying said residual signal with in-phase and quadrature signals derived from said removed component.

2. The method of claim 1 wherein said another domain is at least one of time domain, frequency domain, numerical domain, and modulation domain.

3. The method of claim 1 wherein said component is selected by a user.

4. The method of claim 1 wherein said receiving a signal further comprises receiving at least one of a physiological signal, petrochemical processing system signal, and a voltage or current signal proportional to other physical quantities.

5. A system comprising:
   an interface for receiving a signal;
   a display for simultaneously displaying 1) a suppressed phasor domain representation of said signal, and 2) a representation of said signal in another domain; and
   a processor for:
      performing a time to frequency domain transform on said signal to produce an array of signal components in the frequency domain, and removing a component from said array of signal components;
      performing a frequency to time domain transform on said array to generate a residual time domain signal; and digitally multiplying said residual time domain signal with in-phase and quadrature signals derived from said removed component.

6. The system of claim 5 wherein said another domain is at least one of time domain, frequency domain, numerical domain, and modulation domain.

7. A system comprising:
   means for receiving a signal; and
   means for simultaneously displaying 1) a suppressed phasor domain representation of said signal, and 2) a representation of said signal in another domain,
   wherein said means for displaying said suppressed phasor domain representation of said signal further comprises:
      means for performing a time to frequency domain transform on said signal to produce an array of signal components in the frequency domain;
      means for removing a component from said array of signal components for use as a reference component;
      means for performing a frequency to time domain transform on said array to generate a residual time domain signal; and
      means for digitally multiplying said residual signal with in-phase and quadrature signals derived from said removed component.

8. The system of claim 7 wherein said another domain is at least one of time domain, frequency domain, numerical domain, and modulation domain.

9. The system of claim 7 wherein said component is selected by a user.

10. The system of claim 7 wherein said means for receiving a signal further comprises means for receiving at least one of a physiological signal, petrochemical processing system signal, and a voltage or current signal proportional to other physical quantities.

* * * * *